United States Patent
Ngai et al.

(10) Patent No.: US 8,941,233 B1
(45) Date of Patent: Jan. 27, 2015

(54) INTEGRATED CIRCUIT PACKAGE WITH INTER-DIE THERMAL SPREADER LAYERS

(75) Inventors: Tony Ngai, Saratoga, CA (US); Arifur Rahman, San Jose, CA (US)

(73) Assignee: Altera Corporation, San Jose, CA (US)

( * ) Notice: Subject to any disclaimer, the term of this patent is extended or adjusted under 35 U.S.C. 154(b) by 14 days.

(21) Appl. No.: 13/402,632

(22) Filed: Feb. 22, 2012

(51) Int. Cl.
*H01L 23/34* (2006.01)

(52) U.S. Cl.
USPC .......... 257/712; 257/686; 257/706; 257/717; 257/E23.08; 257/E25.013

(58) Field of Classification Search
CPC ............... H01L 2225/06589; H01L 23/367; H01L 2225/1058; H01L 2225/06541; H01L 23/34; H01L 23/36; H01L 23/42
USPC ......... 257/675, 712, 717, 723, 773, 686, 698, 257/705, 713, 720, E23.08, E25.013
See application file for complete search history.

(56) References Cited

U.S. PATENT DOCUMENTS

| | | | |
|---|---|---|---|
| 6,507,115 | B1 | 1/2003 | Hofstee et al. |
| 7,205,651 | B2 | 4/2007 | Do et al. |
| 2006/0197181 | A1 * | 9/2006 | Noguchi ................ 257/530 |
| 2007/0090517 | A1 | 4/2007 | Moon et al. |
| 2010/0019377 | A1 | 1/2010 | Arvelo et al. |
| 2010/0187670 | A1 | 7/2010 | Lin et al. |
| 2011/0042820 | A1 | 2/2011 | Knickerbocker |
| 2012/0007229 | A1 * | 1/2012 | Bartley et al. ............ 257/712 |

OTHER PUBLICATIONS

Bakir et al., "Revolutionary Innovation in System Interconnection: A New Era for the IC," School of Electrical and Computer Engineering, Georgia Institue of Technology, Proc. SPIE 7928, 792803 (2011), Jan. 2011.

* cited by examiner

*Primary Examiner* — Marcos D. Pizarro
*Assistant Examiner* — Cesar Lopez (57) ABSTRACT

Integrated circuit (IC) packages with an inter-die thermal spreader are disclosed. A disclosed IC package includes a plurality of stacked dies disposed on a package substrate. A heat spreader is disposed on a top die of the plurality of stacked dies. The IC package further includes a thermal spreader layer disposed adjacent to at least one die of the plurality of stacked dies. The thermal spreader layer may extend out of a periphery of the plurality of stacked dies and may be attached to the heat spreader through a support member.

13 Claims, 7 Drawing Sheets

INTEGRATED CIRCUIT PACKAGE WITH INTER-DIE THERMAL SPREADER LAYERS

BACKGROUND

An integrated circuit (IC) package generally includes, among others, a substrate, a die placed on the substrate and a heat spreader placed over the die to dissipate heat from the IC package. The die is generally coupled to the substrate through wires or solder bumps. Signals from the integrated circuit die may then travel through the wires or solder bumps to the substrate.

Generally, an IC package may include more than one die. As different types of devices may cater to different types of applications, more dies may be required in some devices to meet the requirements of high performance applications. Accordingly, to obtain better performance and higher density, multiple dies may be stacked on top of each other in an IC package.

However, as more dies are placed in an IC package, more heat may be generated by the numerous dies in the package. Therefore, efficient heat dissipation is generally required in a multi-die package as excessive heat may adversely affect the overall performance and reliability of the device.

Generally, to dissipate heat from a multi-die package with multiple dies stacked on top of each other, a heat spreader or heat sink is generally placed on the top-most die. Thus, heat generated by the numerous dies in the package may be dissipated only through the heat spreader on the top and the substrate at the bottom of the stacked dies.

Such IC package structures may not be able to dissipate heat efficiently when increasingly more dies are stacked within the IC package. In general, the middle die, or dies, located at the center of the die stack, may be substantially hotter than the top and bottom dies. In some instances, the middle die may be tens of degrees hotter than the top-most die, due to the relative distance between the middle die and the heat spreader on the top-most die.

SUMMARY

An effective heat dissipation mechanism is desirable for multi-die package structures. Embodiments of the present invention include integrated circuit (IC) package structures with inter-die thermal spreader layers to improve heat dissipation.

It is appreciated that the present invention can be implemented in numerous ways, such as a process, an apparatus, a system, a device, or a method on a computer readable medium. Several inventive embodiments of the present invention are described below.

In one embodiment, an IC package is disclosed. The IC package includes a plurality of stacked dies disposed on a substrate. A heat spreader is disposed on a top die of the plurality of stacked dies. A thermal spreader layer is disposed adjacent to at least one die of the plurality of stacked dies. The thermal spreader layer may extend out of a periphery of the plurality of stacked dies and may be attached to the heat spreader through a support member.

In another embodiment, another IC package is disclosed. The IC package includes a substrate. A first die with a plurality of solder bumps on a bottom surface is disposed on the substrate. A second die having a plurality of solder bumps on a center region of a bottom surface is disposed over the first die. The IC package further includes an interposer with a plurality of through-silicon vias (TSVs) and a plurality of solder bumps on a bottom surface. The interposer is disposed between the first die and the second die such that the interposer is disposed beneath the center region of the bottom surface of the second die, covering a center region of a top surface of the first die. A first heat spreader is disposed adjacent to the interposer and on a perimeter of the top surface of the first die. The first heat spreader may extend out of a periphery of the first and second dies.

In yet another embodiment, another IC package is disclosed. The IC package includes a first die disposed on a substrate and a thermal spreader layer disposed on a top surface of the first die. The thermal spreader layer is disposed such that it covers a region of the top surface of the first die, leaving an exposed region on the top surface of the first die. A second die having a plurality of solder bumps on a bottom surface is disposed on the first die. The plurality of solder bumps on the second die may be in direct contact with the exposed region of the top surface of the first die. A heat spreader is disposed on a top surface of the second die. An edge of the thermal spreader layer may extend over a periphery of the first and second dies and a support member may be attached to the edge of the thermal spreader layer and the heat spreader.

In another embodiment, a method of packaging an IC is provided. The method includes disposing a first die over a substrate. A thermal spreader layer is then disposed over a top surface of the first die. The thermal spreader layer may cover at least a portion of the top surface of the first die, leaving an exposed region on the top surface of the first die. An edge of the thermal spreader layer may extend over a periphery of the first die. A second die is disposed over the thermal spreader layer and the top surface of the first die such that a plurality of solder bumps on the second die is coupled to the exposed region on the top surface of the first die. A heat spreader is disposed over the second die and the edge of the thermal spreader layer is coupled to the heat spreader through a support member.

Further features of the invention, its nature and various advantages, will be more apparent from the accompanying drawings and the following detailed description of the preferred embodiments.

DETAILED DESCRIPTION

The embodiments provided herein include integrated circuit (IC) structures and packaging techniques for improved heat dissipation.

It will be obvious, however, to one skilled in the art, that the present exemplary embodiments may be practiced without some or all of these specific details. In other instances, well-known operations have not been described in detail in order not to unnecessarily obscure the present embodiments.

ICs are generally packaged in plastic or ceramic packages and are connected to other external components through wires or solder balls. Some IC packages may include more than one die as different ICs or semiconductor dies may be packaged together as a single device.

Depending on the complexity of the application that a device supports, multiple dies may be packaged in the device. The dies typically share a common substrate as they are packaged as a single device. In order to include more dies in a single package without substantially increasing the size of the substrate, flip chip ICs may be used and most, if not all, of the dies in the device may be stacked in a vertical configuration.

Stacking the dies results in a smaller device footprint as a wider substrate is not needed to accommodate all the dies in the device. Stacking may also allow for faster interconnect communication between the dies in the device as the connection paths between one IC to another may be relatively shorter.

However, as more dies are stacked, the temperature in the IC package may increase substantially. Usually, a heat sink or heat spreader may be placed on top of the die stack to dissipate heat from the IC package. However such a configuration may not be able to efficiently dissipate excess heat from the middle of the die stack. It is therefore desirable to have thermal spreader layers that may be placed in between the dies in the package in order to efficiently dissipate heat generated by die stack.

One of the embodiments describes a multi-die IC package with a thermal spreader layer placed in between every two dies for better heat dissipation. The thermal spreader layer may extend over a periphery of the stack of dies and may then be connected to a heat spreader on top of the stack of dies. In another embodiment, the top-most die in the die stack includes through-silicon vias (TSVs) for transferring heat from the die stack to a heat spreader placed on top of the die stack. If desired, one or more dies other than the top-most die may include TSVs for transferring heat from that die (and, potentially, from dies adjacent to that die) to the thermal spreader layer or the heat spreader.

Figure 1A:
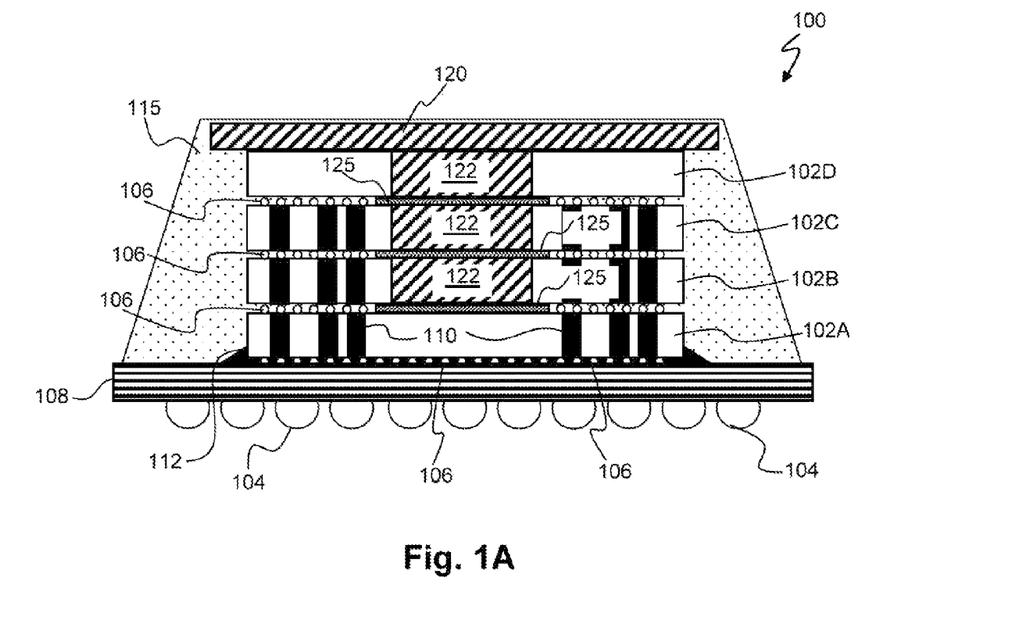
FIG. 1A is a front view of an illustrative integrated circuit (IC) package with four dies and a plurality of thermal spreader layers placed in between the dies in accordance with an embodiment of the present invention.

FIG. 1A is a front view of an illustrative IC package 100 with four dies 102A-102D and a plurality of thermal spreader layers 125 placed in between dies 102A-102D in accordance with an embodiment of the present invention. It should be appreciated that dies 102A-102D may be flip chip dies with a plurality of solder bumps 106 on one side of each of the dies. IC package 100 may be encapsulated by molding compound 115. In one embodiment, molding compound 115 may include an epoxy resin compound.

Dies 102A-102D, stacked on top of each other, may be disposed over substrate 108. It should be appreciated that the cavity between the plurality of solder bumps 106 on die 102A and substrate 108 may be filled with under-fill material 112 or sealing resin to fill the gap and protect the solder joints between solder bumps 106 and substrate 108. The plurality of solder bumps 106 on dies 102B-102D connects dies 102B-102D to each other and die 102A, and the plurality of solder bumps 106 on die 102A in turn connects die 102A to substrate 108.

As an example, signals from dies 102A-102D may be transmitted outside of IC package 100 by solder bumps 106 on die 102A and solder balls 104 on the opposing side of substrate 108. In the embodiment of FIG. 1A, each of dies 102A-102C may include a plurality of through-silicon vias (TSVs) 110. Signals from any of dies 102A-102D may travel through the plurality of TSVs 110 and the plurality of solder bumps 106 to substrate 108.

Heat spreader 120 may be placed over the stack of dies 102A-102D to allow heat to escape from IC package 100. In one embodiment, heat spreader 120 may be connected to die 102D through a non-conductive adhesive. A thermal spreader layer 125 may be placed in between each die in the stack of dies 102A-102D to further dissipate heat from IC package 100. In the embodiment of FIG. 1, the plurality of thermal spreader layers 125 may be connected to heat spreader 120 through a plurality of support members 122. It should be appreciated that adhesive may be used to connect the plurality of support members 122 to each of the plurality of thermal spreader layers 125 and heat spreader 120.

In one embodiment, each of the plurality of thermal spreader layers 125 may be a layer of copper (Cu) that is disposed across a center region of a surface of each of dies 102A-102C. In an exemplary embodiment, the height or thickness of each of the plurality of thermal spreader layers 125 may be substantially equivalent, or substantially close, to the height of the plurality of solder bumps 106 adjacent to each of the plurality of thermal spreader layers 125.

Figure 1B:
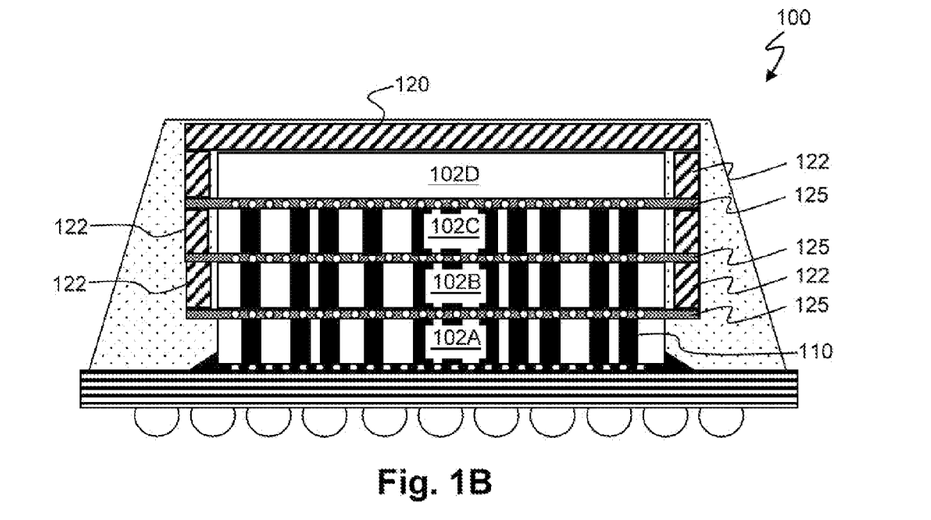
FIG. 1B is a side view of an illustrative IC package in accordance with one embodiment of the present invention.

FIG. 1B is a side view of illustrative IC package 100 in accordance with one embodiment of the present invention. It should be appreciated that for the sake of brevity, components already shown in IC package 100 of FIG. 1A and described above will not be repeated. In the embodiment of FIG. 1B, heat spreader 120 and the plurality of thermal spreader layers 125 may extend over a periphery of each of dies 102A-102D. It should be appreciated that in alternate embodiments, the plurality of thermal spreader layers 125 may also extend out of a periphery of the plurality of support members 122.

In the embodiment illustrated in FIG. 1B, each of the plurality of support members 122 that connects the plurality of thermal spreader layers 125 to heat spreader 120 is placed on a portion of a perimeter of each of the plurality of thermal spreader layers 125. In one embodiment, each of the plurality of support members 122 may have a height that is substantially equal to a height or thickness of each of a corresponding die 102B-102D. In another embodiment, the plurality of support members 122 may be a plurality of heat spreader components that are each similar to heat spreader 120. Accordingly, heat from ICs 102A-102D may be dissipated through the plurality of thermal spreader layers 125, the plurality of support members 122, and heat spreader 120.

Figure 1C:
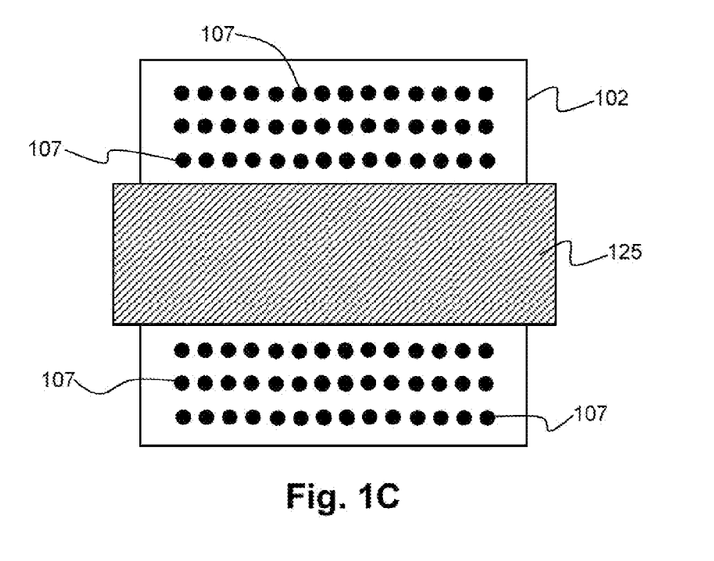
FIG. 1C is a top-down view of a surface of an illustrative die and a thermal spreader layer placed across a center region of the die in an illustrative IC package such as the IC package of FIG. 1A in accordance with one embodiment of the present invention.

FIG. 1C is a top-down view of a surface of illustrative die 102 and thermal spreader layer 125 placed across a center region of die 102 in accordance with one embodiment of the present invention. It should be appreciated that die 102 may be any one of dies 102A-102C of FIGS. 1A and 1B. A plurality of contact pads 107 are shown on the surface of IC 102. It should be appreciated that the plurality of solder bumps 106 of FIGS. 1A and 1B may be placed on the plurality of contact pads 107.

In the embodiments of FIGS. 1A and 1B, signals may travel from one die to another through the plurality of solder bumps 106, the plurality of contact pads 107, and the plurality of TSVs 110. In one embodiment, there may be no contact pads 107 or TSVs 110 in the region where IC 102 is covered by thermal spreader layer 125.

Figure 2:
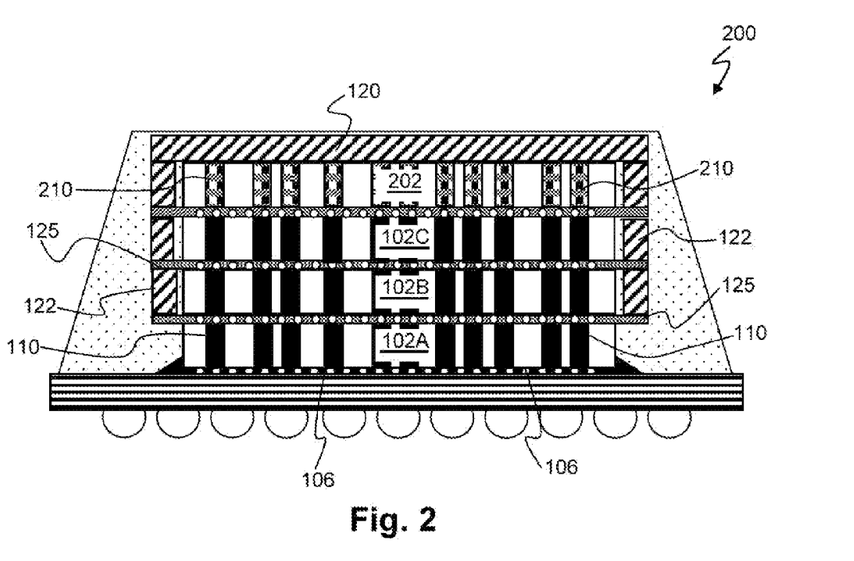
FIG. 2 is a side view of an illustrative IC package with a plurality of thermal spreader layers and a plurality of through-silicon vias (TSVs) in a top-most die in accordance with one embodiment of the present invention.

FIG. 2 is a side view of an illustrative IC package 200 with a plurality of thermal spreader layers 125 and with a plurality of TSVs 210 in top most die 202 in accordance with one embodiment of the present invention. It should be appreciated that IC package 200 shares similarities with IC package 100 of FIGS. 1A and 1B. As such, for the sake of brevity, elements that have been described above, such as dies 102A-102C, the pluralities of TSVs 110 and solder bumps 106, and the plurality of support members 112, will not be described in detail.

In the embodiment of FIG. 2, top most die 202 in IC package 200 includes a plurality of TSVs 210 that may be used to dissipate heat from IC package 200. In one embodiment, the plurality of TSVs 210 in die 202 may be similar to the plurality of TSVs 110 in dies 102A-102C. However, while the plurality of TSVs 110 may be used to transfer signals between dies 102A-102C, the plurality of TSVs 210 may be used to dissipate heat vertically from the stack of dies, 102A-120C and 202, to heat spreader 120 on top of die 202. In an exemplary embodiment, the plurality of TSVs 210 may not be electrically coupled to circuitry in top most die 202.

Figure 3A:
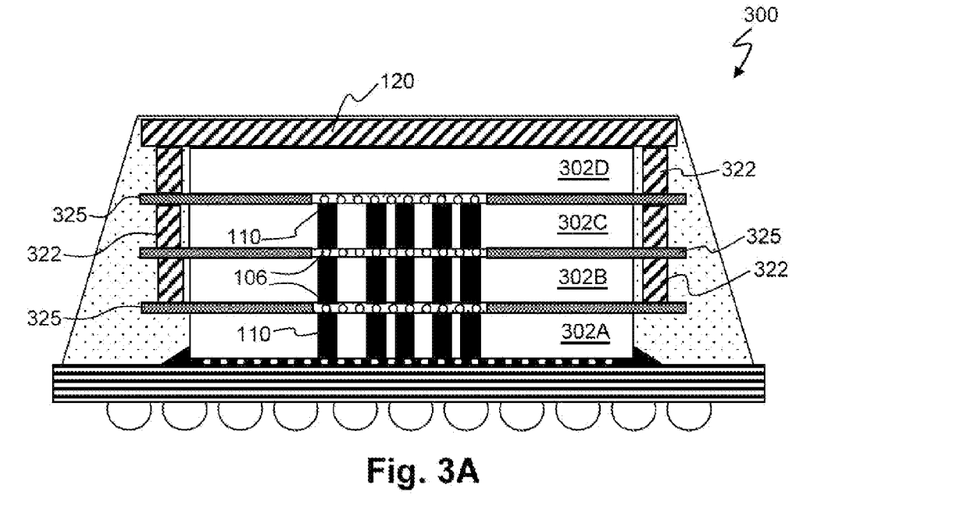
FIG. 3A is a side view of an illustrative IC package with a plurality of thermal spreader layers placed in between four dies in accordance with one embodiment of the present invention.

FIG. 3A is a side view of an illustrative IC package 300 with a plurality of thermal spreader layers 325 placed in between dies 302A-302D in accordance with one embodiment of the present invention. In the embodiment of FIG. 3A, the plurality of thermal spreader layers 325 are placed at the edges of dies 302A-302D. The plurality of thermal spreader layers 325 may also extend over the peripheries of dies 302A-302D.

The plurality of thermal spreader layers 325 may be connected to each other and heat spreader 120 through support members 322. In the embodiment of FIG. 3A, a center region of each of dies 302B-302D has a plurality of solder bumps 106 and a plurality of TSVs 110. Dies 302A-302C may not have TSVs 110 or solder bumps 106 in a portion of the perimeter region that is covered by the plurality of thermal spreader layers 325.

Figure 3B:
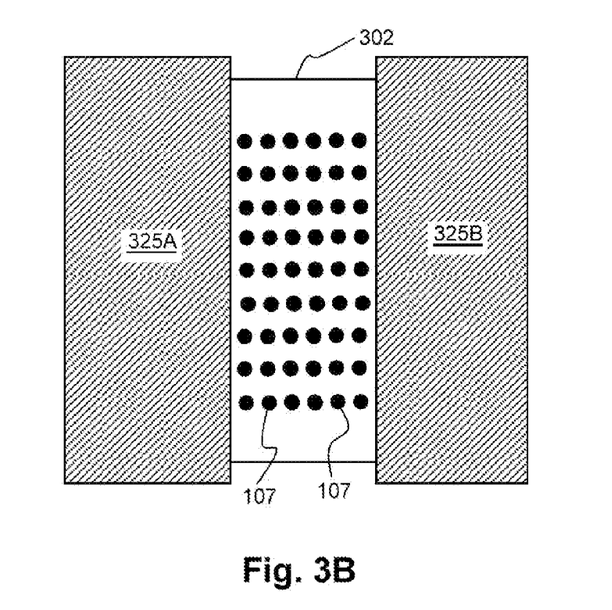
FIG. 3B is a top-down view of an illustrative die with two thermal spreader layers such as the IC package of FIG. 3A in accordance with one embodiment of the present invention.

FIG. 3B is a top-down view of an illustrative die 302 with thermal spreader layers 325A and 325B in accordance with one embodiment of the present invention. It should be appreciated that die 302 may be any one of dies 302A-302C of FIG. 3A. The surface of die 302 may have a plurality of contact pads 107. Accordingly, the plurality of solder bumps 106 of FIG. 3A may be placed on the plurality of contact pads 107 as shown in the embodiment of FIG. 3B.

In the embodiment of FIG. 3A, signals may travel from one die to another through the plurality of solder bumps 106, and the plurality of TSVs 110. In one embodiment, the plurality of thermal spreader layers 325 of FIG. 3A may be formed by multiple pieces of thermal spreader layers, such as thermal spreader layers 325A and 325B of FIG. 3B. In one embodiment, thermal spreader layers 325a and 325B may be placed on two sides of a perimeter of die 302 while the plurality of contact pads 107 may be disposed on a center region of a surface of die 302. In another embodiment, thermal spreader layers 325A and 325B may be disposed on the top surface of die 302, covering an arbitrarily shaped region of the top surface of die 302 and leaving an exposed region on the top surface of die 302. In an exemplary embodiment, contact pads 107 may be disposed on the exposed region of the top surface of die 302 and there may be no contact pads 107 or TSVs 110 in the region where die 302 is covered by thermal spreader layers 325A and 325B.

Figure 4A:
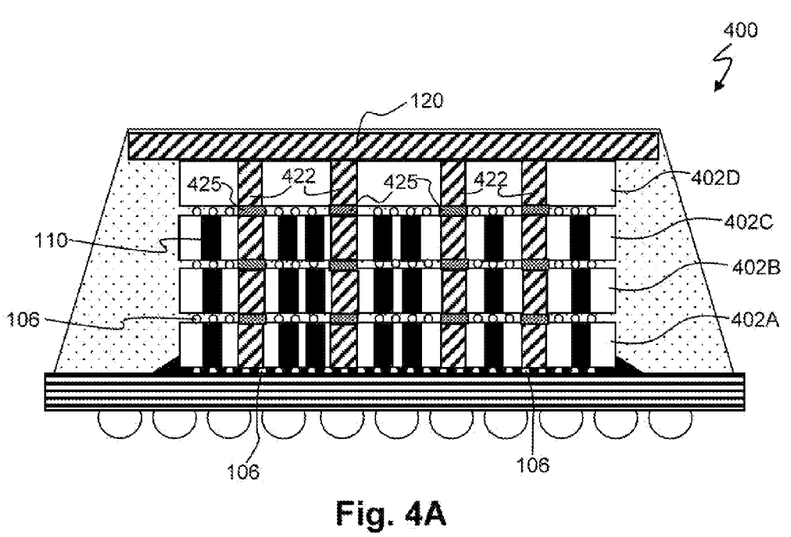
FIG. 4A is a front view of an illustrative IC package with distributed thermal spreader layers in accordance with one embodiment of the present invention.

FIG. 4A is a front view of an illustrative IC package 400 with distributed thermal spreader layers 425 in accordance with one embodiment of the present invention. A plurality of thermal spreader layers 425 may be placed over a portion of a surface of each of dies 402A-402C. In the embodiment of FIG. 4A, the bottom-most die, die 402A, may have a plurality of solder bumps 106 disposed on a bottom surface of die 402A.

In one embodiment, each of dies 402B-402D may have a plurality of solder bumps 106 on a portion of a bottom surface that is not covered by the plurality of thermal spreader layers 425. Each of ICs 402A-402C may also include a plurality of TSVs 110 that connects the plurality of solder bumps 106 from one die to another.

Each of the plurality of thermal spreader layers 425 may be coupled to a corresponding thermal spreader layer and heat spreader 120 through support member 422. In one embodiment, each of the plurality of support members 422 may have a width that is substantially equal to the width of its corresponding thermal spreader layer 425 and a height that is substantially equal to the height or thickness of its corresponding die, 402A, 402B, 402C, or 402D.

Figure 4B:
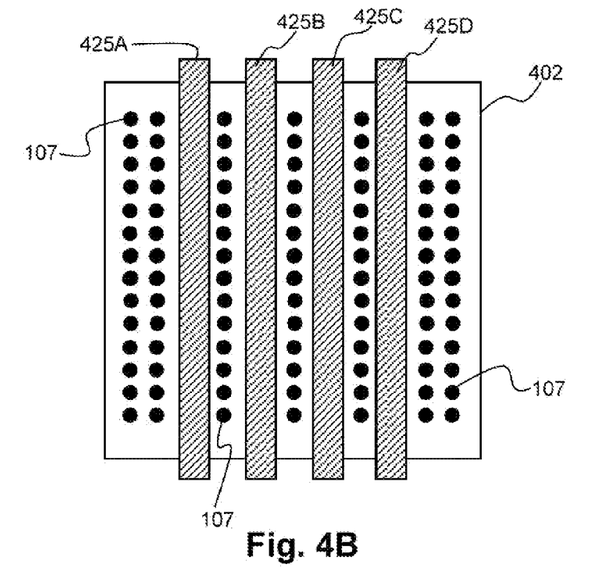
FIG. 4B is a top-down view of an illustrative die with a plurality of distributed thermal spreader layers such as the IC package of FIG. 4A in accordance with one embodiment of the present invention.

FIG. 4B is a top-down view of an illustrative die 402 with a plurality of distributed thermal spreader layers 425A-425D in accordance with one embodiment of the present invention. It should be appreciated that die 402 may be any one of dies 402A-402C of FIG. 4A. The surface of die 402 may have a plurality of contact pads 107 and the plurality of solder bumps 106 of FIG. 4A may be placed on the plurality of contact pads 107.

In the embodiment of FIG. 4B, the plurality of thermal spreader layers 425A-425D may be placed substantially parallel to each other on the surface of die 402. In one embodiment, thermal spreader layers 425A-425D may be of different widths and lengths (and may each be arbitrarily shaped). In another embodiment, thermal spreader layers 425A-425D may be substantially similar in size. Each of thermal spreader layers 425A-425D may be placed adjacent to the plurality of contact pads 107. It should be appreciated that having a plurality of thermal spreader layer strips similar to thermal spreader layers 425A-425D may allow solder bumps 106 and TSVs 110 of FIG. 4A to be relatively evenly distributed in dies 402A-402C. In one embodiment, there may be no contact pads 107 or TSVs 110 in the regions where die 402 is covered by thermal spreader layers 425A-425D. It should be appreciated that even though four thermal spreader layers 425A-425D are shown in the embodiment of FIG. 4B, more or fewer thermal spreader layers may be used in this context.

Figure 5:
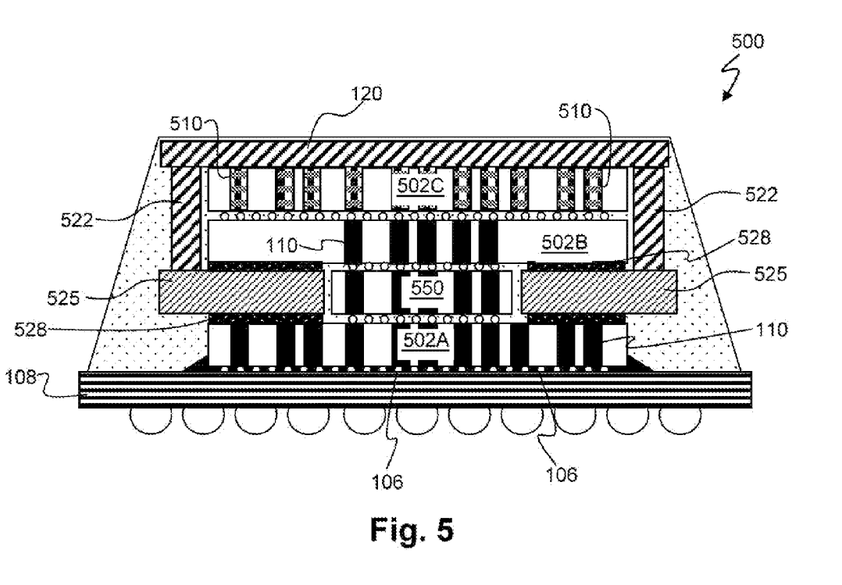
FIG. 5 is a side view of an illustrative IC package with a thermal spreader layer in accordance with one embodiment of the present invention.

FIG. 5 is a side view of an illustrative IC package 500 with a thermal spreader layer 525 in accordance with one embodiment of the present invention. IC package 500 includes a plurality of stacked dies 502A-502C. Die 502A, disposed over substrate 108, includes a plurality of solder bumps 106 and a plurality of TSVs 110.

A relatively smaller die 550 may be placed on a center region of a top surface of die 502A. Thermal spreader layer 525 may be placed adjacent to die 550 on the top surface of die 502A. Die 550 includes a plurality of solder bumps 106 and a plurality of TSVs 110. In one embodiment, die 550 may be an active die that is relatively smaller in size compared to dies 502A-502C. In another embodiment, die 550 may be a passive component (e.g., a dummy or non-operative die) that may act as an interposer layer between dies 502A and 502B. In one such embodiment, electrical signals from die 502A may be transmitted to IC 502B, and vice versa, through the plurality of solder bumps 106 and TSVs 110 of die 550.

In one embodiment, thermal spreader layer 525 may be a single piece of thermal spreader layer that covers a perimeter of the top surface of die 502A, exposing a center region of the top surface of die 502A. Accordingly, die 550 may be placed on the exposed center region of the top surface of die 502A. In another embodiment, thermal spreader layer 525 may include a plurality of thermal spreader layers that may cover at least a portion of a perimeter of the top surface of die 502A. It should be appreciated that thermal spreader layer 525 may be connected to die 502A and die 502B through adhesive 528.

Die 502B may include a plurality of solder bumps 106 and a plurality of TSVs 110 in a center region of die 502B. In the embodiment of FIG. 5, the plurality of solder bumps 106 and the plurality of TSVs 110 in die 502B align with the plurality of solder bumps 106 and the plurality of TSVs 110 in die 550.

Die 502C may be placed on top of die 502B. Die 502C includes a plurality of solder bumps 106 that covers a substantial portion of a bottom surface of die 502C and a plurality of TSVs 510 that extends from the bottom surface to the top surface of die 502C. Heat spreader 120 may be placed on the top surface of die 502C. In one embodiment, instead of transmitting signals, the plurality of TSVs 510 in die 502C may be used to dissipate heat from die 502C to heat spreader 120.

Support member 522 may be used to connect thermal spreader layer 525 to heat spreader 120 to allow heat from the middle of the die stack to be dissipated to heat spreader 120 through thermal spreader layer 525. In the embodiment of FIG. 5, the thickness or height of support member 522 may be substantially equal to the thickness or height of dies 502B and 502, and the plurality of solder bumps 106 on ICs 502B and 502C, combined. Even though dies 502A-502C and die 550 are shown in the embodiment of FIG. 5, it should be appreciated that more or fewer dies may be included in IC package 500 as needed. Accordingly, it should also be appreciated that more thermal spreader layers similar to thermal spreader layer 525 may be placed in between the dies.

Figure 6:
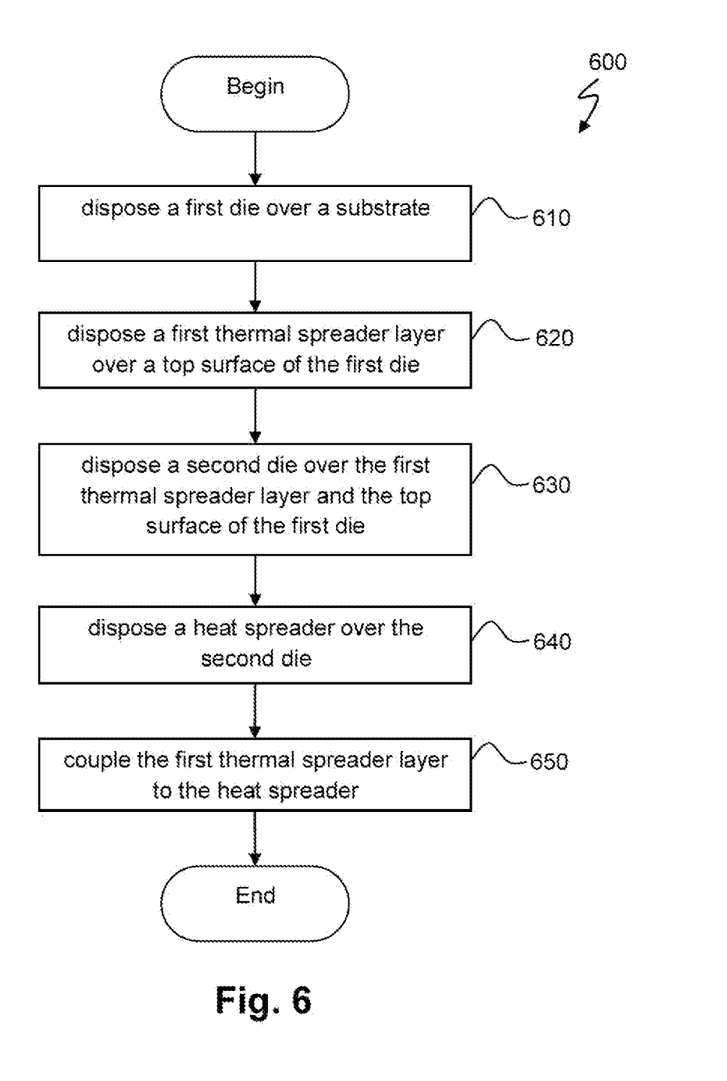
FIG. 6 shows simplified method for packaging an IC in accordance with one embodiment of the present invention.

FIG. 6 shows simplified method 600 for packaging an IC in accordance with one embodiment of the present invention. At step 610, a first die is disposed over a substrate. A first thermal spreader layer is then disposed over a top surface of the first dies at step 620. In one embodiment, the first thermal spreader layer may cover at least a portion of the top surface of the first die, leaving an exposed region on the top surface of the first die. In the embodiment of FIG. 1C, thermal spreader layer 125 is placed over a center region of die 102 such that two edges of thermal spreader layer 125 extends over the periphery of die 102, leaving a portion of the top surface of die 102 exposed.

At step 630, a second die is disposed over the first thermal spreader layer and the top surface of the first die. In one embodiment, the second die may have a plurality of solder bumps that is coupled to the exposed region on the top surface of the first die. In the embodiment of FIG. 1A, die 102B is shown disposed over die 102A with a plurality of solder bumps 106 on die 102B contacting the exposed region (not covered by thermal spreader layer 125) on the top surface of die 102A.

A heat spreader is disposed over the second die at step 640. The first thermal spreader layer is then coupled to the heat spreader at step 650. In an exemplary embodiment, edges of the first thermal spreader layer may extend over a periphery of the first and second dies and the heat spreader is coupled to the edges of the first thermal spreader layer through a support member. In the embodiment of FIG. 3A, thermal spreader layers 325 are coupled to heat spreader 120 through support members 322.

It should be appreciated that even though specific configurations are shown in the embodiments of FIGS. 1A-5, different configurations may be employed in this context. It should be appreciated that a flip chip package with a ball grid array is provided in the exemplary illustrations of FIGS. 1A-5. However, the use of flip chip ball grid array IC packages is not meant to be limiting as the techniques described herein may be applied to other packaging configurations (e.g., heat spreader ball grid arrays (HSBGAs), low profile ball grid arrays (LBGAs), thin fine pitch ball grid array (TFBGAs), flip chip chip-scale packages (FCCSPs), etc).

The method and apparatus described herein may be incorporated into any suitable circuit. For example, the method and apparatus may be incorporated into numerous types of devices such as microprocessors or other ICs. Exemplary ICs include programmable array logic (PAL), programmable logic arrays (PLAs), field programmable logic arrays (FPGAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), just to name a few.

The programmable logic device described herein may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by the assignee.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

The foregoing is merely illustrative of the principles of this invention and various modifications can be made by those skilled in the art without departing from the scope and spirit of the invention.

What is claimed is:

1. An integrated circuit package comprising:
a plurality of stacked dies disposed on a substrate, wherein a given die out of the plurality of stacked dies has a width, a length, and a thickness that is less than the width and less than the length;
a heat spreader disposed on a top die of the plurality of stacked dies;
at least two separate thermal spreader layers, wherein each of the at least two separate thermal spreader layers is disposed adjacent to a first side of the given die of the plurality of stacked dies, wherein each of the at least two separate thermal spreader layers extends out of a periphery of the plurality of stacked dies, wherein each of the at least two separate thermal spreader layers has a length that at least extends across one of the width and the length of the given die, and wherein each of the at least two separate thermal spreader layers has first and second ends that respectively extend past first and second opposing sides of the given die; and
support members that are disposed along the first and second sides of the given die, that are attached to the first and second ends of the at least two separate thermal spreader layers, and that are attached to the heat spreader.

2. The integrated circuit package defined in claim 1, wherein the top die comprises a plurality of through-silicon vias extending from a top surface of the top die to a bottom surface of the top die, wherein the plurality of through-silicon vias are operable to dissipate heat from the integrated circuit package through the heat spreader and are not electrically coupled to circuitry in the top die.

3. The integrated circuit package defined in claim 1, wherein the support member comprises a plurality of heat spreader elements stacked on top of each other, wherein the plurality of heat spreader elements connects a perimeter of the thermal spreader layer to a perimeter of the heat spreader disposed on the top die.

4. The integrated circuit package defined in claim 3, wherein each of the heat spreader elements has a thickness that is substantially equal to a thickness of at least one die from of the plurality of dies.

5. The integrated circuit package defined in claim 1, wherein each of the plurality of stacked dies comprises a plurality of solder bumps on a bottom surface, wherein dies of the plurality of stacked dies are electrically coupled to each other through the plurality of solder bumps, and wherein a thickness of the thermal spreader layer is substantially equivalent to a height of at least a portion of the plurality of solder bumps.

6. The integrated circuit package defined in claim 5, wherein at least one die of the plurality of stacked dies comprises a plurality of through-silicon vias operable to transmit signals from the plurality of solder bumps on the bottom surface to a top surface of the at least one die.

7. The integrated circuit package defined in claim 5, wherein the plurality of solder bumps is disposed on a center region of the bottom surface of at least one the dies from the plurality of stacked dies.

8. The integrated circuit package defined in claim 5, wherein the thermal spreader layer covers a perimeter region of a top surface of the at least one die, and wherein the thermal spreader layer extends out of a periphery of the support member.

9. An integrated circuit package comprising:
a first die disposed on a substrate;
a thermal spreader layer disposed on a top surface of the first die, wherein the thermal spreader layer covers a region of the top surface of the first die, leaving an exposed region on the top surface of the first die;
a second die having a plurality of solder bumps on a bottom surface, disposed on the first die, wherein the plurality of solder bumps is in direct contact with the exposed region of the top surface of the first die, wherein first and second edges of the thermal spreader layer extend past respective first and second opposing sides of the first and second dies;
a heat spreader, disposed on a top surface of the second die; and
support members disposed along the first and second opposing sides of the first and second die, attached to the first and second edges of the thermal spreader layer, and attached to the heat spreader.

10. The integrated circuit package of claim 9, further comprising:
a third die having a plurality of through-silicon vias extending from a top surface of the third die to a bottom surface of the third die, disposed between the second die and the heat spreader, wherein the plurality of through-silicon vias is operable to dissipate heat from the integrated circuit package through the heat spreader.

11. The integrated circuit package of claim 9, wherein a surface area of the first die is greater than the surface area of the second die, wherein a thickness of the thermal spreader layer is substantially equivalent to a thickness of the second die, wherein the second die is disposed on a center region of the top surface of the first die, and wherein the thermal spreader layer surrounds the second die and covers a perimeter of the top surface of the first die.

12. The integrated circuit package of claim 9, wherein a height of the thermal spreader layer is substantially equivalent to a height of the plurality of solder bumps on the bottom surface of the second die.

13. The integrated circuit package of claim 12, wherein the thermal spreader layer comprises a plurality of parallel thermal spreader strips, each thermal spreader strip having an edge that extends over the periphery of the first and second dies, wherein the support member comprises a plurality of heat spreader elements, each spreader element attached to the edge of the each thermal spreader strip.

* * * * *